United States Patent [19]

Washburn

[11] 4,025,847
[45] May 24, 1977

[54] MEASUREMENT SYSTEM INCLUDING BRIDGE CIRCUIT

[75] Inventor: Ralph G. Washburn, Marion, Mass.

[73] Assignee: The Sippican Corporation, Marion, Mass.

[22] Filed: Aug. 27, 1975

[21] Appl. No.: 608,030

[52] U.S. Cl. .................. 324/65 R; 73/362 AR; 323/75 H; 323/75 N; 324/DIG. 1
[51] Int. Cl.² ........................................ G01R 27/02
[58] Field of Search .............. 324/65 R, DIG. 1; 73/362 AR, 170 A; 323/75 H, 75 N

[56] References Cited

UNITED STATES PATENTS

| | | | |
|---|---|---|---|
| 3,273,396 | 9/1966 | Beck | 324/DIG. 1 |
| 3,287,978 | 11/1966 | Knudsen | 324/DIG. 1 |
| 3,531,990 | 10/1970 | Shinskey | 73/362 AR X |
| 3,688,581 | 9/1972 | Le Quernec | 323/75 H X |

*Primary Examiner*—Stanley T. Krawczewicz

[57] ABSTRACT

In a measurement system having a sensor the electrical resistance $R_s$ of which varies as a function of a parameter being measured, and a bridge circuit having the sensor and a long transmission wire in a first arm connected to a first control node, a second long transmission wire in a second arm connected to a second control node, and third and fourth arms respectively connected to the first and second nodes, the wires having equal resistances $R_c$, the wires being connected to the sensor and being arranged so that any resistance-changing conditions affect both wires equally during operation of the system, that improvement wherein the third bridge arm is connected between the first control node and a first current injection node, the fourth bridge arm is connected between the second control node and a second current injection node, a reference voltage source is provided, first active control circuitry is connected to receive inputs from the first and second control nodes and from the voltage source, and to provide to the first injection node a current controlled so as to maintain the control nodes at a predetermined voltage difference related to the voltage at the source, second active control circuitry is connected to the bridge to provide to the second injection node a current controlled so as to maintain the injection nodes at a voltage difference related to the predetermined difference, and output circuitry is connected to the bridge to provide an output related to one of the controlled currents.

18 Claims, 2 Drawing Figures

MEASUREMENT SYSTEM INCLUDING BRIDGE CIRCUIT

BACKGROUND OF THE INVENTION

This invention relates to measurement systems of the type in which a sensor, the electrical resistance of which varies as a function of the parameter being measured, is electrically connected in one arm of a bridge circuit, often through a transmission line sufficiently long to require consideration of its electrical impedance in the bridge design. The invention is particularly applicable to oceanography systems in which thermisters are used to measure water temperature, and is an improvement upon what is disclosed in U.S. Pat. Nos. 3,221,556; 3,339,407; and Re 27,103. Many systems to which the invention is applicable include a second long transmission wire connected in a second arm of the bridge, the two transmission wires having equal resistances $R_c$ and being arranged so that any resistance-changing conditions affect both wires equally during operation of the system. Third and fourth arms are respectively connected to the first and second arms at first and second control nodes. A reference voltage is introduced into the bridge, and active control circuitry is provided to balance the bridge by controlling the currents in the bridge arms. The bridge current is then measured to provide a readout indicative of the value of the parameter being measured.

SUMMARY OF THE INVENTION

The invention makes possible the use of a single, preferably grounded power source to supply reference, scale offset, and operating voltages to the circuit. The need for an isolated or floating reference voltage source is avoided. The same power source may be used for several such bridge circuits (each including its own sensor) arranged in parallel. The reference voltage source and the sensor may have a common ground, e.g., to seawater. The circuit is highly accurate, yet reliable and inexpensive. Direct electrical readout from the bridge (rather than, e.g., through an electromechanical servo) of an output voltage $E_o$ representative of the sensor resistance $R_s$ is provided.

In general the invention features an improvement wherein the third bridge arm is connected between the first control node and a first current injection node; the fourth bridge arm is connected between the second control node and a second current injection node; a reference voltage source is provided; first active control circuitry is connected to receive inputs from the first and second control nodes and from the voltage source, and to provide to the first injection node a current controlled so as to maintain the control nodes at a predetermined voltage difference related to the voltage at the source; second active control circuitry is connected to the bridge to provide to the second injection node a current controlled so as to maintain the injection nodes at a voltage difference related to said predetermined difference; and output circuitry is connected to the bridge to provide an output related to one of the controlled currents. In preferred embodiments the second control circuitry is connected to receive inputs from both injection nodes and the voltage source, and the two control circuitries maintain the voltage difference between the control nodes and that between the injection nodes at half the voltage of the source; the two control circuitries are connected to each other to cause equal currents to be delivered to both injection nodes; the output circuitry receives inputs from an injection node, the second control node, and the reference voltage source, and combines those inputs to provide an output which is independent of the voltage at the second control node, and which is offset by a voltage derived from the source, so that the output is stabilized against reference voltage variations at the low end of the temperature scale of measurement and against resistance variations in the transmission wires and the sea electrode (or other return connection completing the circuit to the sensor, such as a third transmission wire), and preferably is a selected value at a selected low temperature $T_0$; the circuitries include operational amplifiers, and the reference voltage is derived from the source of operating power for the amplifiers; the first control circuitry includes an operational amplifier having its non-inverting input connected to receive a voltage input $E_r$ from said voltage source and further connected, through a buffer, to the second control node to receive a voltage input $E_c$ corresponding to current flow through $R_c$, and having its inverting input connected to the first control node, the third arm is connected as a negative feedback loop of said amplifier and has a resistance value selected to equal $R_s$ at a selected low temperature $T_0$, whereby the output of said amplifier is at a voltage $E_c = 2E_r$ at $T_0$, and said output circuitry is connected to receive first and second inputs of $E_c$ and $2E_r$ from the buffer and the voltage source, respectively, and to receive as a third input the output of the amplifier, and includes circuitry for subtracting the sum of the first and second inputs from the third input so that the voltage output of the system will be zero at $T_0$; one side of the sensor and one side of the source are commonly grounded; the sensor comprises a thermister and a linearization resistor connected in series; the transmission wires are in a twin-wire cable; and there are a plurality of bridge circuits each having its own sensor, and the source is connected as a common reference voltage source for the bridge circuits. In some embodiments the cable is partially spooled in a bathythermograph probe.

Other advantages and features of the invention will appear from the following description of a preferred embodiment thereof, including the drawing.

DESCRIPTION OF THE PREFERRRED EMBODIMENT

Figure 1:
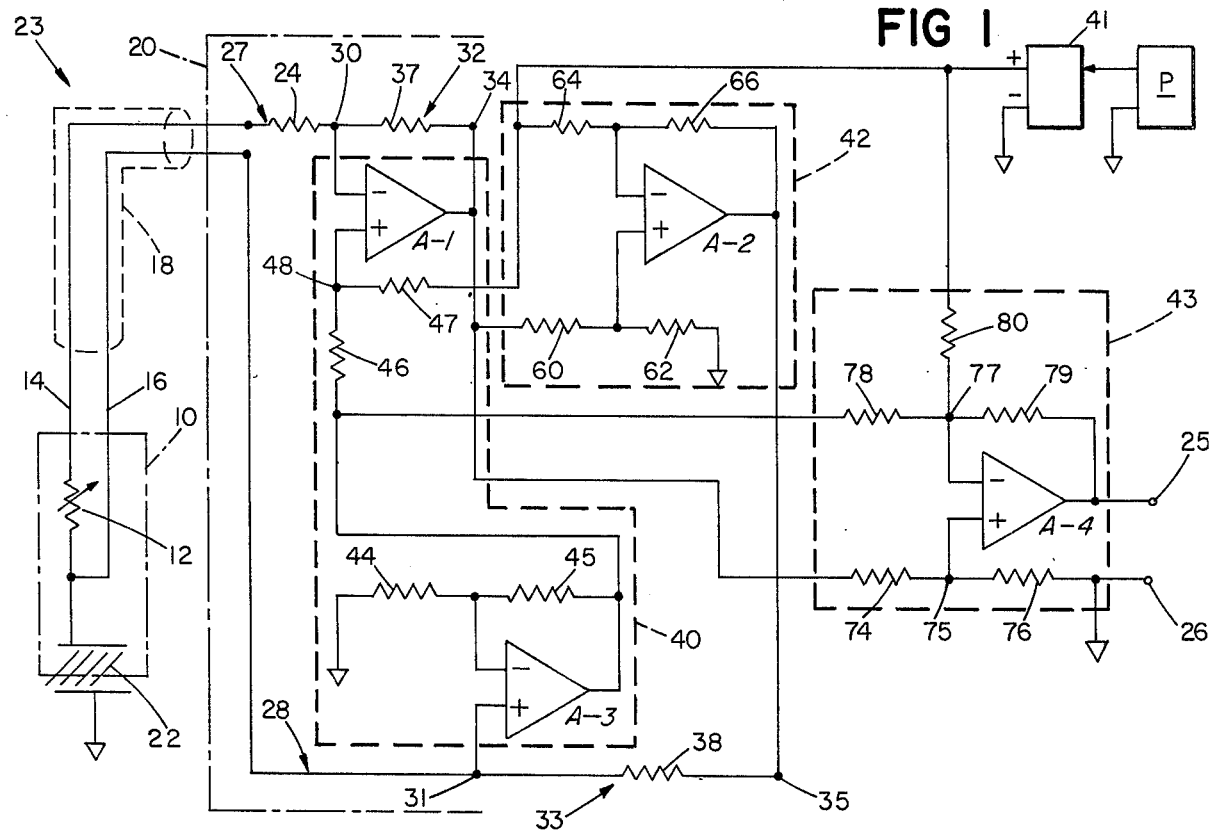
FIG. 1 is a schematic diagram of a system embodying the invention.

Referring to FIG. 1, bathythermograph probe 10 carries a thermister 12 the terminals of which are respectively connected to copper wires 14 and 16 of twin-wire insulated magnet wire cable 18 which extends between the probe and a measuring station 20 (e.g., a ship). The overall system may be of the sort described in U.S. Pat. No. 3,221,556, e.g., and would in that case include suitable spooling apparatus in the probe and at station 20 to enable deployment of the probe from a moving ship; such a system, using a sea electrode 22 and seawater return path to complete the circuit to the thermister, is just one of many measurement systems in which the invention can be advantageously embodied.

Cable 18 and thermister 12 form part of measuring bridge circuit 23 which at terminals 25, 26 provides a DC output voltage $E_o$ representative of the temperature sensed by the thermister. $E_o$ can be used, e.g., to drive a readout meter, or even to feed a computer. Resistor 24 is connected in series with thermister 12 and has a resistance $R_1$ chosen in the middle of the thermister resistance ($R_t$) range over the temperature range to be measured, to provide a first order linearization of the output voltage-temperature relationship, in accordance with known thermister output linearization circuit principles. $E_o$ is thus a function of the combined resistance $R_s$ of thermister 12 and resistor 24, and in that sense resistor 24 can be considered as forming part of the sensor.

One leg 27 of bridge 23 is formed by wire 14, thermister 12, and resistor 24 connected in series. A second leg 28 is formed by wire 16. The third and fourth legs 32 and 33, respectively, are formed by resistors 37 and 38 of equal value R. Control node 30 connects legs 27 and 32. Control node 31 connects legs 28 and 33. Legs 32 and 33 terminate respectively at separate current injection nodes 34 and 35.

Because of the length of cable 18, changes during operation in the resistances of wires 14 and 16, as well as changes in the resistance of sea electrode 22, are substantial enough to affect the bridge electrically. However, by ensuring that these wires have equal resistances $R_c$ ($R_c$ includes the resistance of electrode 22 which is common to legs 27 and 28), connecting them in opposite legs of the bridge (with the sea electrode common to those legs), and packaging them in a single cable so that they are exposed identically to any resistance-changing physical conditions (e.g., elongation), $E_o$ is made substantially independent of changes in $R_c$ during operation.

Operational amplifier A-1 is connected to serve as an active bridge balancing element, maintaining equal currents through the arms of the bridge. To that end, active control circuitry 40 (which includes A-1) is connected with inputs from control nodes 30 and 31 and from a stable, grounded (to seawater) reference voltage source 41 (which supplies a voltage equal to twice a reference voltage $E_r$), and has its output connected to current injection node 34 to provide a controlled current I thereto; and active control circuitry 42 is connected to receive inputs from source 41 and from nodes 34 and 35, and has its output connected to deliver an equal controlled current I to injection node 35. Circuitry 40 maintains a voltage difference of $E_r$ between control nodes 30 and 31, regardless of resistance changes in sensor 12 or wires 14 and 16. Similarly, circuitry 42 maintains the voltage difference between injection nodes 34 and 35 at $E_r$. Output circuitry 43 has an input from circuitry 40 which enables it to measure the bridge current, to thereby provide on terminals 25, 26 an output voltage $E_o$ indicative of the bridge current and hence of the temperature to which the probe is exposed. Additional inputs to circuitry 43 provide for scaling, independence from transmission wire resistance, and accuracy, as explained below.

More particularly, circuitry 40 includes operational amplifiers A-1 and A-3, with associated resistors 44-7. Node 31 (at a voltage $E_c$ corresponding to current through $R_c$) is connected to the non-inverting input of A-3. A-3 acts as a buffer and (with proper choice of resistors 44 and 45) a gain of two amplifier. The output of A-3 ($2E_c$) is applied to one end of a voltage divider consisting of resistors 46 and 47, while a voltage $2E_r$ from source 41 is applied to the other end of the divider. The voltage from the mid point 48 of the divider (equal to $E_c + E_r$) is applied to the inverting input of A-1 while the controlled current output I of A-1 is connected to injection node 34, placing third arm resistor 37 in the feedback loop of A-1. Amplifier A-1 will therefore operate to control the current (I) through legs 27 and 32 so that the voltage at node 30 will be equal to $E_c + E_r$. Thus, the voltage at node 30 will be maintained at a predetermined value $E_r$ above that of node 31.

Control circuitry 42 consists of operational amplifier A-2 and its associated gain-controlling resistors 60, 62, 64, and 66. The voltage at node 34 (denoted $E_{34} = E_c + E_r + IR$) is applied across a voltage divider consisting of resistors 60 and 62. The voltage from the mid-point of this divider is applied directly to the non-inverting input of A-2 while the voltage $2E_r$ from source 41 is applied to the inverting input through resistor 64. The values of resistors 60, 62, and 64, and feedback resistor 66, are chosen so as to maintain the controlled current output I of A-2 at a voltage equal to $E_{34} - E_r = E_c + IR$, and this output is connected to injection node 35 to complete the bridge loop. The effect of A-2 is to maintain junction 35 at a voltage decrement $E_r$ below junction 34. The bridge is accordingly driven to a balance at condition in which the current I through legs 27 and 32 equals that through legs 28 and 33 and is of a magnitude to make the aggregate voltage drop ($E_s$) across the sensor resistance $R_s$ equal to the reference voltage $E_r$.

Output circuitry 43 consists of adder/subtractor operational amplifier A-4 with associated resistors 74-6 and 78-80. The output of A-1 ($E_c + E_r + IR$) is supplied to resistor 74, which forms a voltage divider network with resistor 76. The mid-point of the divider is connected to the non-inverting input of A-4. The output of A-3 ($2E_c$) is connected to resistor 78, which forms a divider network with feedback resistor 79. The divider midpoint 77 is connected through resistor 80 to source 41, and in addition is connected directly to the inverting input of A-4. The values of resistors 74-6 and 78-80 are selected so that the three voltages supplied to output circuitry 43 through resistors 74, 78, and 80, respectively, are, at the inputs of A-4, scaled in the ratio 1:0.5:1. A-4 adds $E_c + 2E_r$ and subtracts the sum from the output of A-1, leaving $E_o = IR - E_r$ at the output of A-4. Thus, the input to A-4 from A-3 makes $E_o$ independent of $E_c$, and the input to A-4 from source 41 not only cancels the $E_r$ term from the output of A-1, but in addition introduces a scale offset term equal to $-E_r$.

By choosing the common value R of resistors 37 and 38 to be equal to $R_s$ at a selected lowest temperature $T_0$ on the desired measurement scale, the voltage IR at the output of A-1 will equal $E_s$ (and hence $E_r$) at $T_0$. Thus, the output of A-4 ($E_o$) at $T_0$ will be zero, which is a desirable readout arrangement.

The offset voltage not only provides the desired readout scaling, but also ensures that the net voltages supplied to A-4 are within the capacity range of easily available op amps.

By using the same reference voltage source 41 to both standardize the bridge currents and provide the output offset, $E_o$ is substantially stabilized against what could otherwise be accuracy-reducing variations in $E_r$ in the low temperature portion of the measurement scale.

A-3 serves as a buffer between node 31 and the output circuitry.

Figure 2:
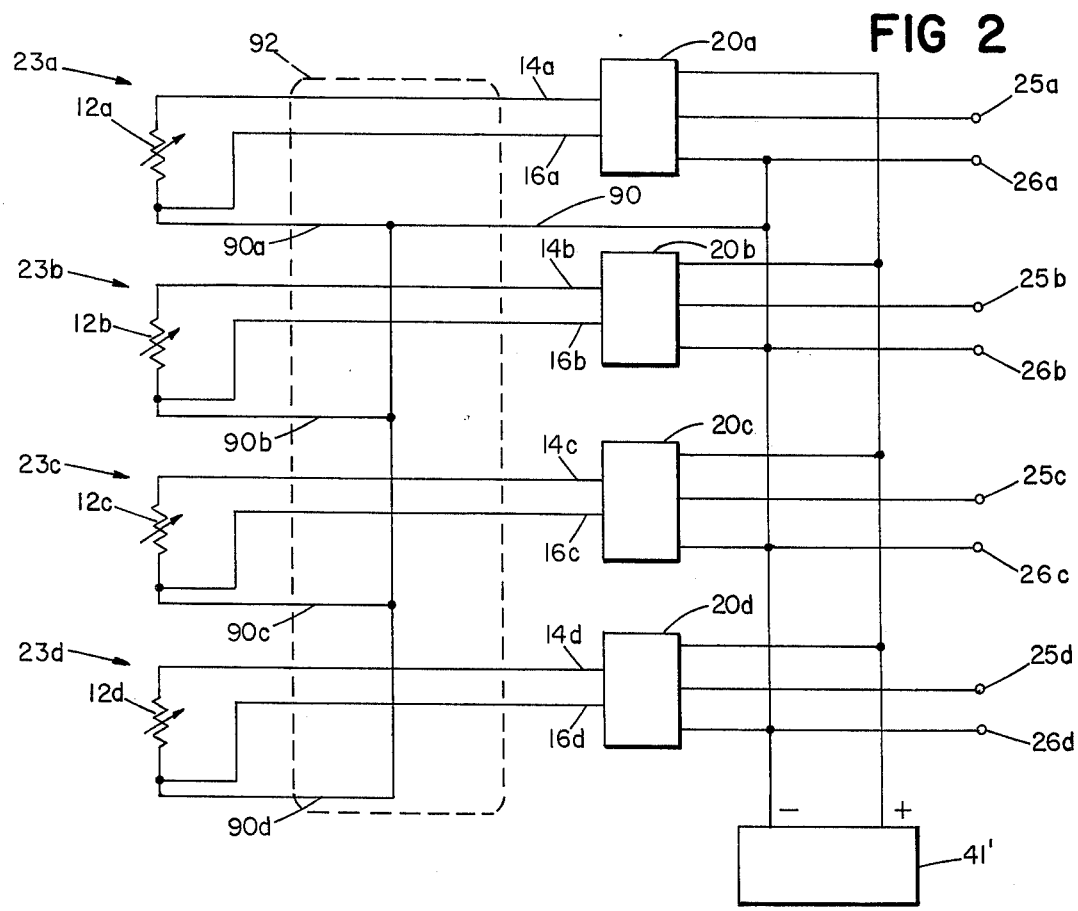
FIG. 2 is a schematic diagram of a multi-bridge embodiment of the invention.

The fact that reference voltage source 41 may be connected with a grounded terminal allows the reference voltage to be derived from the same power source P (FIG. 1) used to provide the op amps with their operating power. Furthermore, a single source can be used for a plurality of measuring bridge circuits, each having its own thermister (e.g., to continuously measure temperature at different ocean depths), as is shown in FIG. 2: Source 41' feeds bridge circuits 23a, b, c, and d, each of which includes long, heavy gauge, paired transmission wires 14a–d and 16a–d, and a thermister 12a–d. Each box 20a–d represents the shipboard circuitry 20 shown in FIG. 1, and the respective output voltages are provided on terminals 25a–d, 26a–d. Instead of a seawater return path, a return wire 90 has branches 90a–d connected to the respective thermisters. The various wires are combined in a single cable 92. The use of a common reference voltage source is not only economical, but in addition ensures that any variations in $E_r$ will affect all the bridges equally.

Resistance values (in ohms) for a typical FIG. 1 embodiment are:

$R_t$ . . . ranges from 18308 at 28° F to 3193 at 96° F
$R_l$ . . . 5,607
R . . . 23,915
$R_c$ . . . 10K
R 46, 47 . . . 16.9K
R 44, 45 . . . 8,250
R 60, 66 . . . 10K
R 62, 64, 79 . . 20K
R 78 . . . . 10,992
R74, 80 . . . 5,496
R76 . . . . 7,094

Other embodiments are within the following claims.

What is claimed is:

1. In a measurement system having a sensor the electrical resistance $R_s$ of which varies as a function of a parameter being measured, and a bridge circuit having said sensor and in a first arm connected to a first control node, a second arm connected to a second control node, and third and fourth arms respectively connected to said first and second nodes, that improvement wherein said third bridge arm is connected between said first control node and a first current injection node, said fourth bridge arm is connected between said second control node and a second current injection node, a reference voltage source is provided, first active control circuitry is connected to receive inputs from said first and second control nodes and from said voltage source, and to provide to said first injection node a current controlled so as to maintain said control nodes at a predetermined voltage difference related to the voltage at said source, second active control circuitry is connected to said bridge to provide to said second injection node a current controlled so as to maintain said injection nodes at a voltage difference related to said predetermined difference, and output circuitry is connected to said bridge to provide an output related to one of said controlled currents.

2. The improvement of claim 1 wherein said second control circuitry is connected to receive inputs from said first and second injection nodes and from said voltage source, and includes circuitry for maintaining said current provided to said second injection node at a value equal to said current provided to said first injection node and for maintaining said injection nodes at a voltage difference equal to said predetermined voltage difference.

3. The improvement of claim 1 wherein said predetermined voltage difference is equal to half the voltage at said source.

4. The improvement of claim 1 wherein said first and second control circuitries are connected to each other to cause equal currents to be delivered to both said injection nodes.

5. The improvement of claim 1 wherein said output circuitry is connected to one of said injection nodes to receive as a first input one of said controlled currents, is connected to receive as a second input a voltage related to the voltage at said second control node, and is connected to said voltage source to receive as a third input a voltage related to the voltage at said source, and said output circuitry includes circuitry for combining said first, second, and third inputs to provide an output independent of the voltage at said second control node and including a selected scale offset derived from said source, whereby the output of said system is stabilized against reference voltage variations at the low end of the temperature scale of measurement.

6. The improvement of claim 5 wherein said sensor includes a sensing element mounted in an oceanographic probe, said probe also carrying a sea electrode connected to said sensing element for grounding said element to seawater, said reference voltage source also having a seawater ground connection, said second input to said output circuitry thereby serving to make said output of said system independent of variations in the resistance of said sea electrode.

7. The improvement of claim 5 wherein said output circuitry includes elements selected so that said scale offset will cause said output to be a selected value at a selected low temperature $T_0$.

8. The improvement of claim 1 wherein said circuitries include operational amplifiers, and said reference voltage is derived from the same power source used to supply operating power for said amplifiers.

9. The improvement of claim 1 wherein one side of said sensor and one side of said source are commonly grounded.

10. The improvement of claim 1 wherein said sensor comprises a thermister and a linearization resistor connected in series.

11. The improvement of claim 1 wherein first and second long transmission wires are respectively connected in said first and second arms, said wires having equal resistances $R_c$, said wires being connected to said sensor and being arranged so that any resistance-changing conditions affect both wires equally during operation of said system.

12. The improvement of claim 11 wherein said first control circuitry includes an operational amplifier having its non-inverting input connected to receive a voltage input $E_r$ from said voltage source and further connected, through a buffer, to said second control node to receive a voltage input $E_c$ corresponding to current flow through $R_c$, and having its inverting input connected to said first control node.

13. The improvement of claim 12 wherein said third arm is connected as a negative feed back loop of said amplifier, and has a resistance value selected to equal $R_s$ at a selected low temperature $T_O$, whereby the output of said amplifier is at a voltage $E_c + 2E_r$ at $T_O$, and said output circuitry is connected to receive first and second inputs of $E_c$ and $2E_r$ from said buffer and said voltage source, respectively, and to receive as a third input the output of said amplifier, and includes circuitry for subtracting the sum of said first and second inputs from said third input so that the voltage output of said system will be zero at $T_O$.

14. The improvement of claim 13 wherein said output circuitry includes an operational amplifier connected as an adder/subtractor.

15. The improvement of claim 14 wherein said transmission wires are in a twin-wire cable.

16. The improvement of claim 15 wherein said cable is partially spooled in a bathythermograph probe.

17. The improvement of claim 1 wherein there are a plurality of said bridge circuits each having its own said sensor, and said source is connected as a common reference voltage source for said bridge circuits.

18. The improvement of claim 17 further comprising a return wire connecting said source to each said sensor.

* * * * *

UNITED STATES PATENT AND TRADEMARK OFFICE
CERTIFICATE OF CORRECTION

PATENT NO. : 4,025,847
DATED : May 24, 1977
INVENTOR(S) : Ralph G. Washburn

It is certified that error appears in the above—identified patent and that said Letters Patent are hereby corrected as shown below:

Col. 2, line 27, "$E_c = 2E_r$" should be --$E_c + 2E_r$--.

Col. 6, line 68, "feed back" should be --feedback--.

Signed and Sealed this

Twenty-seventh Day of September 19

[SEAL]

Attest:

RUTH C. MASON
Attesting Officer

LUTRELLE F. PARKER
Acting Commissioner of Patents and Trademar